(12) United States Patent
Tanaka

(10) Patent No.: US 7,127,693 B2
(45) Date of Patent: Oct. 24, 2006

(54) DEVICE FOR CREATING TIMING CONSTRAINTS

(75) Inventor: Genichi Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 551 days.

(21) Appl. No.: 10/617,076

(22) Filed: Jul. 11, 2003

(65) Prior Publication Data

US 2004/0194044 A1    Sep. 30, 2004

(30) Foreign Application Priority Data

Mar. 26, 2003 (JP) ............................. 2003-084909

(51) Int. Cl.
*G06F 17/50*      (2006.01)
(52) U.S. Cl. ........................ 716/6; 716/4; 716/5; 716/7
(58) Field of Classification Search ............. 716/6, 716/7, 4, 5
See application file for complete search history.

(56) References Cited

U.S. PATENT DOCUMENTS 6,487,705 B1* 11/2002 Roethig et al. ................. 716/6
2004/0205683 A1* 10/2004 Kovacs-Birkas et al. ...... 716/6

* cited by examiner

*Primary Examiner*—Sun James Lin
(74) *Attorney, Agent, or Firm*—Buchanan Ingersoll & Rooney PC

(57) ABSTRACT

A datapath extraction unit extracts, from among datapaths on which a timing verification is to be performed, those datapaths from a netlist, timing constraints, and a cell library, that are established between at least two child blocks of a parent block. A datapath output unit prepares and presents to a user a datapath list in which timing exceptions can be specified. A timing constraint modification unit modifies the previous timing constraints according to the timing exceptions specified by the user and creates new timing constraints.

14 Claims, 5 Drawing Sheets

FIG.3

| DATAPATH | false | multi cycle | disable |
|---|---|---|---|
| #1-#5 | ☐ | ☐( ) | ☐ |
| #1-#6 | ☐ | ☐( ) | ☐ |
| #2-#5 | ☐ | ☐( ) | ☐ |
| #2-#6 | ☐ | ☐( ) | ☐ |
| #7-#3 | ☐ | ☐( ) | ☐ |
| #7-#4 | ☐ | ☐( ) | ☐ |
| #8-#3 | ☐ | ☐( ) | ☐ |
| #8-#4 | ☐ | ☐( ) | ☐ |

FIG.4

| DATAPATH | false | multi cycle | disable |
|---|---|---|---|
| #1-#5 | ☑ | ☐( ) | ☐ |
| #1-#6 | ☐ | ☐( ) | ☐ |
| #2-#5 | ☐ | ☐( ) | ☐ |
| #2-#6 | ☐ | ☑(2) | ☐ |
| #7-#3 | ☐ | ☐( ) | ☐ |
| #7-#4 | ☐ | ☐( ) | ☐ |
| #8-#3 | ☐ | ☐( ) | ☐ |
| #8-#4 | ☐ | ☐( ) | ☐ |

| DATAPATH | false | multi cycle | disable | slack |
|---|---|---|---|---|
| #1-#5 | ☐ | ☐( ) | ☐ | -5.105 |
| #1-#6 | ☐ | ☐( ) | ☐ | -0.105 |
| #2-#5 | ☐ | ☐( ) | ☐ | +0.316 |
| #2-#6 | ☐ | ☐( ) | ☐ | -3.761 |
| #7-#3 | ☐ | ☐( ) | ☐ | +0.742 |
| #7-#4 | ☐ | ☐( ) | ☐ | +0.311 |
| #8-#3 | ☐ | ☐( ) | ☐ | +0.462 |
| #8-#4 | ☐ | ☐( ) | ☐ | +0.269 |

FIG.7

| DATAPATH | false | multi cycle | disable |
|---|---|---|---|
| clk-clk | ☐ | ☐( ) | ☐ |
| #1-#5 | ☐ | ☐( ) | ☐ |
| #1-#6 | ☐ | ☐( ) | ☐ |
| #2-#5 | ☐ | ☐( ) | ☐ |
| #2-#6 | ☐ | ☐( ) | ☐ |
| #7-#3 | ☐ | ☐( ) | ☐ |
| clk-clk0 | ☐ | ☐( ) | ☐ |
| #7-#4 | ☐ | ☐( ) | ☐ |
| cl0k-clk | ☐ | ☐( ) | ☐ |
| #8-#3 | ☐ | ☐( ) | ☐ |
| clk0-clk0 | ☐ | ☐( ) | ☐ |
| #8-#4 | ☐ | ☐( ) | ☐ |

FIG.8

| DATAPATH | false | multi cycle | disable |
|---|---|---|---|
| A-B | ☐ | ☐( ) | ☐ |
| clk-clk | ☐ | ☐( ) | ☐ |
| #1-#5 | ☐ | ☐( ) | ☐ |
| #1-#6 | ☐ | ☐( ) | ☐ |
| #2-#5 | ☐ | ☐( ) | ☐ |
| #2-#6 | ☐ | ☐( ) | ☐ |
| #7-#3 | ☐ | ☐( ) | ☐ |
| clk-clk0 | ☐ | ☐( ) | ☐ |
| #7-#4 | ☐ | ☐( ) | ☐ |
| cl0k-clk | ☐ | ☐( ) | ☐ |
| #8-#3 | ☐ | ☐( ) | ☐ |
| clk0-clk0 | ☐ | ☐( ) | ☐ |
| #8-#4 | ☐ | ☐( ) | ☐ |

DEVICE FOR CREATING TIMING CONSTRAINTS

BACKGROUND OF THE INVENTION

1) Field of the Invention

The present invention relates to a timing constraints creating device employed when designing a semiconductor integrated circuit.

2) Description of the Related Art

A bottom-up hierarchical designing is adopted when designing a semiconductor integrated circuit. Such designing involves dividing the whole circuit into a number of blocks, determining the area and the shape of each block, carrying out the detailed designing of each block based on a netlist, and building up the blocks from individual child blocks to form a parent block.

Timing constraints for each respective child block are created in the process of building the blocks by means of connecting the individual blocks. The timing constraints for the parent blocks are created by combining the timing constraints that are created for the child blocks. In this case, during data transfer between the child blocks, there are usually some datapaths that are excluded from a timing verification. Hence, before carrying out the timing optimization in the parent blocks, it is necessary to specify the datapaths that are to be excluded from the timing verification.

However, in the conventional technology, the designer manually specifies datapaths that are to be excluded from the timing verification during data transfer between two child blocks. There is always a possibility that the designer may miss out certain specifications. When such specifications miss occurs, the execution time increases as unnecessary datapaths are also optimized at the time of optimizing the timing for parent blocks. On the other hand, the datapaths that truly need to be optimized may not be optimized.

When a layout is created by using modified timing constraints, if a new error that has not been encountered before occurs, the designer again has to manually confirm whether the error has occurred in a datapath excluded from the timing verification or not. However, as the error occurs repeatedly, the user also has to confirm the same repeatedly, which is not at all desirable. Therefore, this aspect calls for an improvement.

SUMMARY OF THE INVENTION

It is an object of the present invention to solve at least the problems in the conventional technology.

The device according to the present invention includes a datapath extraction unit that extracts datapaths on which a timing verification is to be performed, wherein the datapath extraction unit extracts the datapaths, which are established between at least two child blocks in a parent block, from a cell library that includes description of logic function and timing information of each cell in the parent block, timing constraints that includes definitions of any clocks of the semiconductor integrated circuit, and a netlist that includes connection information between the cells. Moreover, the device includes a datapath output unit that creates a datapath list which allows a user to selectively specify a timing exception corresponding to the datapath extracted, and displays the datapath list for the user; and a timing constraints modification unit that creates new timing constraints by modifying existing timing constraints based on the timing exception specified by the user.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 is a drawing that shows a first example of a datapath list that the datapath output unit shown in FIG. 1 prepares based on the data transfer pattern shown in FIG. 2, from which the user can specify the datapaths to be excluded from a timing verification;

FIG. 4 is a drawing that shows an example of the user specification for the datapath list shown in FIG. 3;

FIG. 7 is a drawing that shows a first example of a datapath list that the datapath output unit shown in FIG. 1 prepares based on the data transfer pattern shown in FIG. 6, from which the user can specify the datapaths to be excluded from a timing verification; and FIG. 8 is a drawing that shows a second example of a datapath list that the datapath output unit shown in FIG. 1 prepares based on the data transfer pattern shown in FIG. 6, from which the user can specify the datapaths to be excluded from a timing verification.

DETAILED DESCRIPTION

Exemplary embodiments of the device according to the present invention are explained next with reference to the accompanying drawings.

Figure 1:
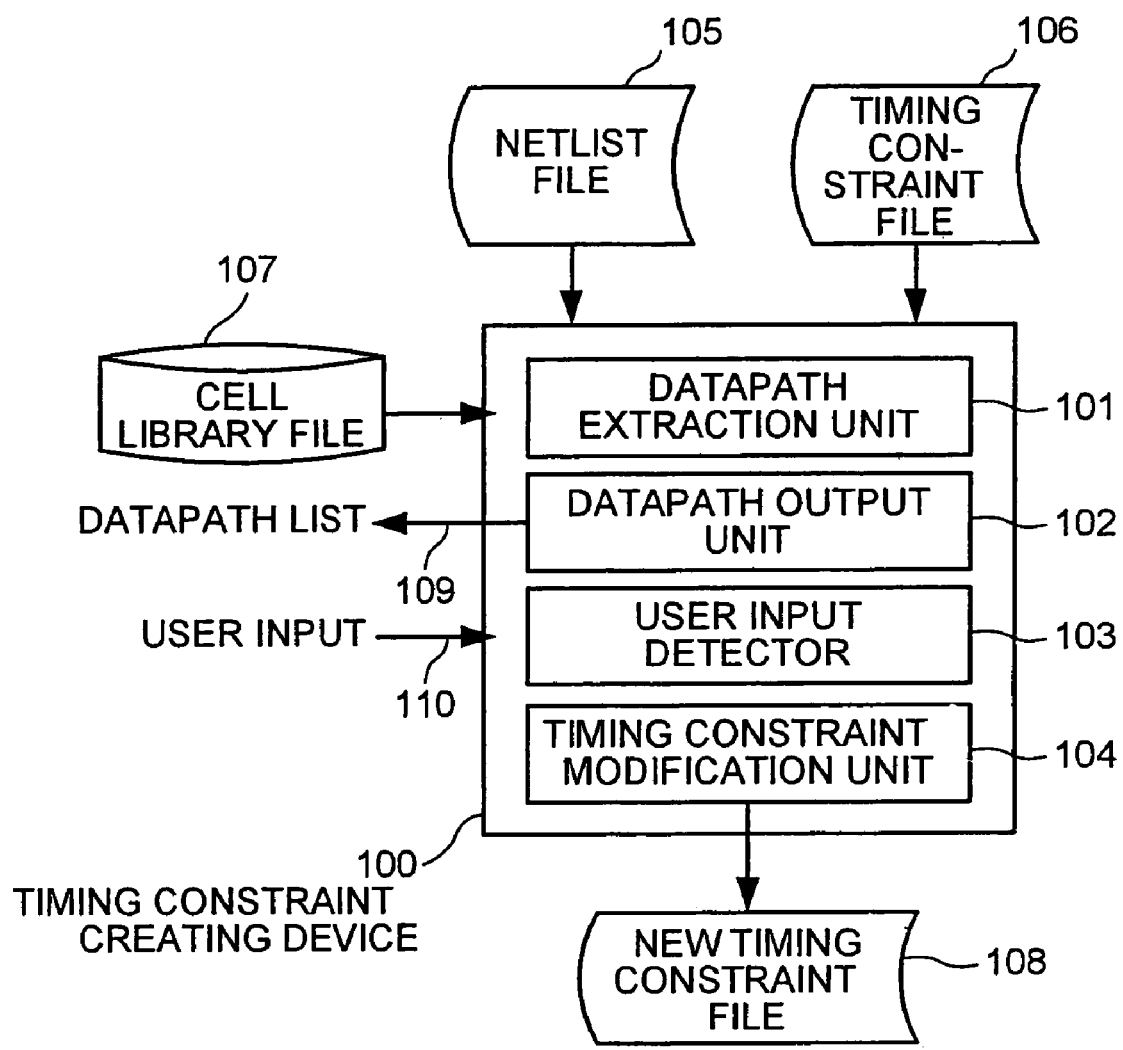
FIG. 1 is a block diagram of a timing constraints creating device according to an embodiment of the present invention.

FIG. 1 is a block diagram of the timing constraints creating device according to the present invention. The timing constraints creating device 100 includes a datapath extraction unit 101, a datapath output unit 102, a user unit detector 103, and a timing constraints modification unit 104. The timing constraints creating device 100 also includes, as peripheral devices, database in the form of a netlist file 105, a timing constraints file 106, a cell library file 107, and an output device in the form of a new timing constraints file 108.

The netlist file 105 stores a netlist that includes information about logical connections of a semiconductor integrated circuit. The timing constraints file 106 stores timing constraints that define the operating speed of a circuit that carries out the analysis of setup and hold. The cell library file 107 stores a library that includes logical product and timing information of each cell.

The datapath extraction unit 101 extracts from among the datapaths on which a timing verification is to be performed, those datapaths, from the netlist, the timing constraints, and the cell library information, that are established between two child blocks of a parent block.

The datapath output unit 102 creates a datapath list 109 after adding to the extracted datapaths at least a field for timing exceptions and outputs the datapath list 109 to a device identifiable to the user (such as a display device, printing device, or a file). The timing exception is a method to exclude a datapath from the timing verification. The datapath that is excluded is, for instance, a false path, a multi cycle path, or a disable path.

The user unit detector 103 detects from a user input 110, in which the user specifies for the datapath list 109 the datapaths to be excluded, the specified datapaths excluded from the timing verification and assigns those datapaths to the timing constraints modification unit 104.

The timing constraints modification unit 104 generates new timing constraints by modifying the timing constraints (either by adding or deleting or both) stored in the timing constraints file 106 and stores these new timing constraints in the new timing constraints file 108. The timing constraints modification unit 104 generates the new timing constraints based on the user specified information of the datapaths excluded from the timing verification.

Figure 2:
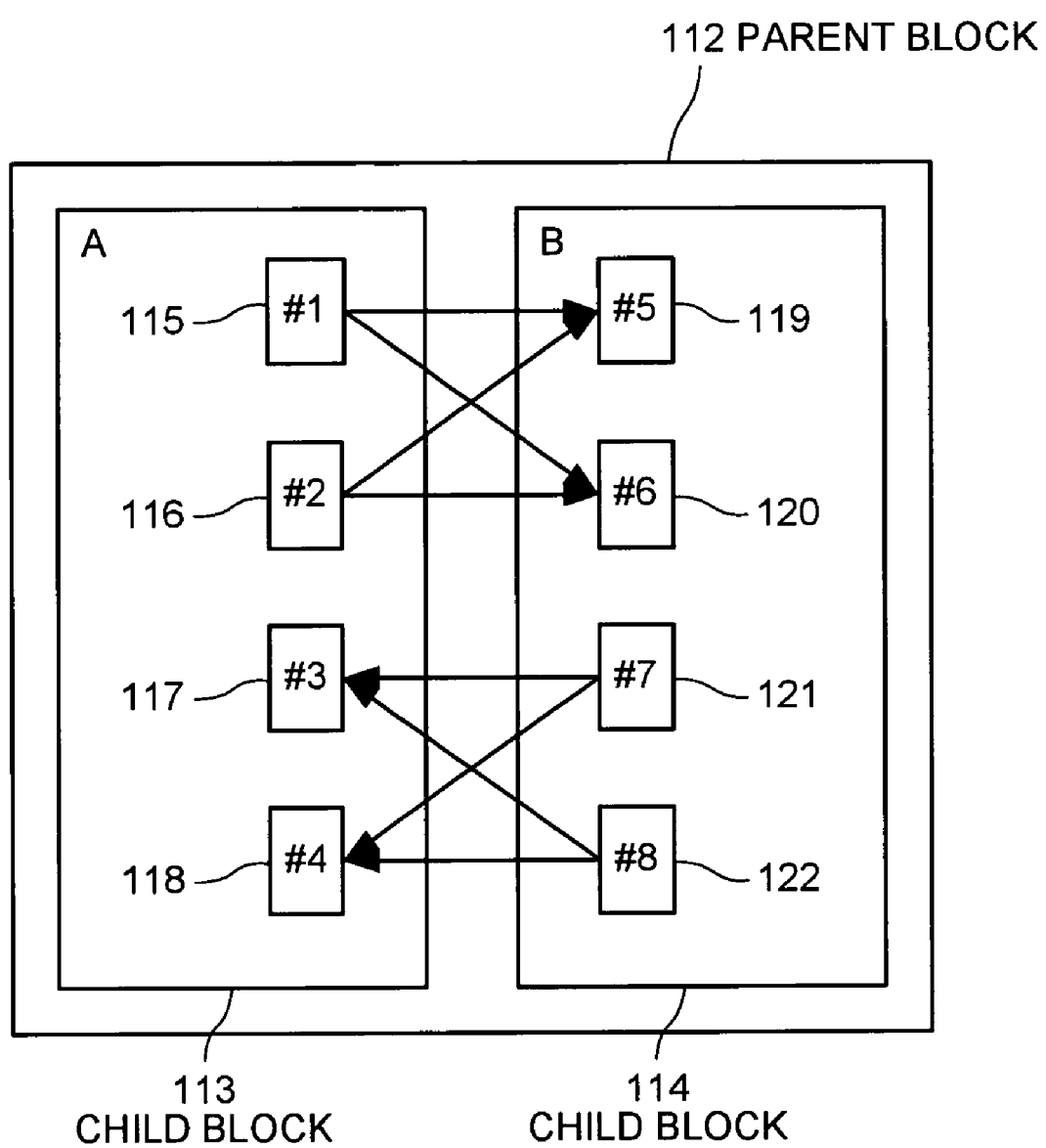
FIG. 2 is a drawing that explains a first type of data transfer pattern between two child blocks that are included in a parent block.

An operation (hereinafter,"working example 1") of the timing constraints creating device 100 is explained next with reference to FIG. 1 through FIG. 4. FIG. 2 shows a first type of data transfer pattern between two child blocks that are included in a parent block. FIG. 3 shows a first example of the datapath list 109 prepared by the datapath output unit 102 based on the data transfer pattern shown in FIG. 2. The user can specify in this list the datapaths are to be excluded from the timing verification. FIG. 4 shows an example of the user specification for the datapath list 109 shown in FIG. 3.

A parent block may include two or more child blocks. For the sake of convenience, a parent block 112 in FIG. 2 is shown to include only two child blocks 113 (also referred to as "child block A") and 114 (also referred to as "child block B").

Each of the child blocks 113 and 114 respectively includes plural sequential logic cells and their combinational circuits. These sequential logic cells can be divided into those that carry out data transfer within one child block and those that carry out data transfer between two adjoining child blocks. In FIG. 2, the sequential logic cells are of the type that carries out data transfer between two adjoining child blocks.

For instance, the child block 113 includes sequential logic cells (#1) 115, (#2) 116, (#3) 117, and (#4) 118. Similarly, the child block 114 includes sequential logic cells (#5) 119, (#6) 120, (#7) 121, and (#8) 122.

Datapaths are established in the direction from the sequential logic cells (#1) 115 and (#2) 116 towards the sequential logic cells (#5) 119 and (#6) 120. Similarly, the datapaths are established in the direction from the sequential logic cells (#7) 121 and (#8) 122 towards the sequential logic cells (#3) 117 and (#4) 118.

The datapath extraction unit 101 extracts the datapaths for verification established in the manner mentioned above between the child block 113 and the child block 114. The datapath extraction unit 101 extracts the datapaths for verification based on the information stored in the netlist file 105, the timing constraints file 106, and the cell library file 107. The datapaths are extracted with the same method that is employed in the timing verification.

The datapath output unit 102 receives the datapaths extracted by the datapath extraction unit 101 and generates the datapath list 109 to be presented to the user. The datapath output unit 102 generates the datapath list, for instance, in the format as shown in FIG. 3. All the datapaths established between the child block 113 and the child block 114, that is, the datapaths [#1-#5], [#1-#6], [#2-#5], [#2-#6], [#7-#3], [#7-#4], [#8-#3], and [#8-#4] are listed under the column 'datapath'.

The datapath list includes check boxes for different options for the timing exceptions, such as 'false', 'multi cycle', and 'disable' for each path so that the user can select these exceptions.

In the example shown in FIG. 4, the option 'false' is checked for the datapath [#1-#5] from the sequential logic cell 115 to the sequential logic cell 119. This indicates that the user has instructed to completely exclude the datapath [#1-#5] from the timing verification, that is, treat the datapath [#1-#5] as a false path.

Also, the option 'multi cycle' is checked for the datapath [#2-#6] from the sequential logic cell 116 to the sequential logic cell 120 and a numeral '2' is entered next to it. This indicates that the user has specified two clock cycles for the datapath [#2-#6].

In the timing constraints modification unit 104, the timing constraints for the datapath [#1-#5], namely false path, and the timing constraints for the datapath [#2-#6], namely multi-cycle path with two cycles, are added to the timing constraints present in the timing constraints file 106.

Though not shown in FIG. 4, if the user selects the option 'disable' corresponding to a datapath, then that datapath is deleted. The timing constraints modified in this way are then created in a format compatible to that of the new timing constraints file 108 and then stored in the new timing constraints file 108.

Consequently, the timing constraints are implemented rapidly without any specifications miss. As a result, the user is released from the cumbersome procedure of manually specifying the datapaths to be excluded from the timing verification, thus resulting in a shortening of the designing time.

Figures 5, 6:
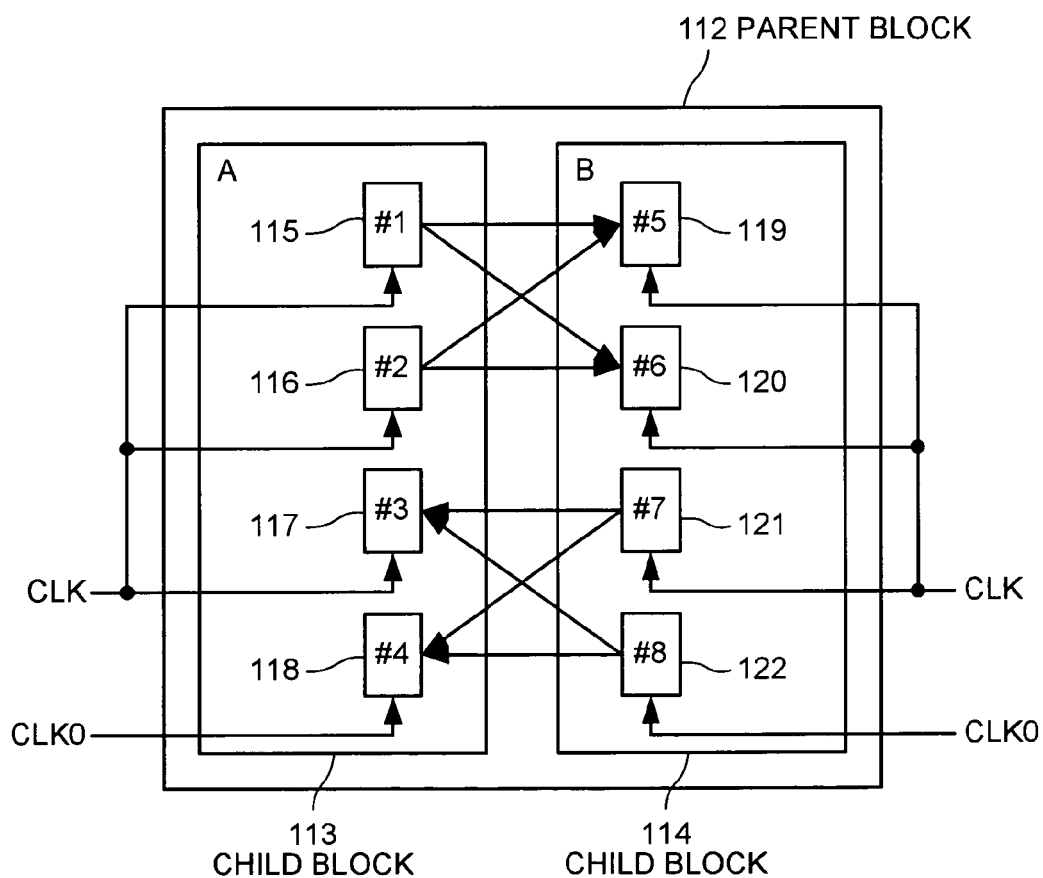
FIG. 5 is a drawing that shows a second example of a datapath list that the datapath output unit shown in FIG. 1 prepares based on the data transfer pattern shown in FIG. 2, from which the user can specify the datapaths to be excluded from a timing verification.
FIG. 6 is a drawing that explains a second type of data transfer pattern between two child blocks that are included in a parent block.

Another example of operation (hereinafter, "working example 2") of the timing constraints creating device 100 is explained next with reference to FIG. 1 through FIG. 3, and FIG. 5. FIG. 5 shows a second example of the datapath list 109 that the datapath output unit 102 shown in FIG. 1 prepares based on the data transfer pattern shown in FIG. 2, from which the user can specify the datapaths to be excluded from the timing verification.

At the time of creating the datapath list 109 for all the datapaths, as shown in FIG. 3, the datapath output unit 102 also adds to the datapath list 109 the timing information ('slack') obtained from the timing verification of each datapath, as shown in FIG. 5.

The additional timing information 'slack' added, as shown in FIG. 5, indicates setup information. However, apart from 'slack', other types of information such as hold information or a drive clock, etc. may also be added to the datapath list 109.

Consequently, the timing constraints are detected efficiently and are implemented even more rapidly without any specifications miss, eventually resulting in a shortening of the designing time.

Still another example of operation (hereinafter, "working example 3") of the timing constraints creating device 100 is explained next with reference to FIG. 1 through FIG. 3, and FIG. 5. In the working examples 1 and 2, the datapath output unit 102 creates the datapath list 109 of all the datapaths, as shown in FIG. 3. However, in the working example 3, the datapath output unit 102 creates the datapath list 109 of only those datapaths in which a timing error has occurred as a result of the timing verification.

In the example shown in FIG. 5, if we assume that the timing error has occurred only in three datapaths [#1-#5], [#1-#6], and [#2-#6], then the datapath output unit 102 creates the datapath list 109 with only these three datapaths [#1-#5], [#1-#6], and [#2-#6] listed in it.

Consequently, the timing constraints are detected efficiently and are implemented even more rapidly without any specifications miss, eventually resulting in a shortening of the designing time.

Still another example of operation (hereinafter, "working example 4") of the timing constraints creating device 100 is explained next with reference to FIG. 1 through FIG. 3, and FIG. 5. In the working example 2, the datapath output unit 102 creates the datapath list 109 of all the datapaths, as shown in FIG. 5. However, in the working example 4, the datapath output unit 102 creates the datapath list 109 of only those datapaths that fall within a certain range of timing as a result of the timing verification. This given range of timing is set beforehand.

In the example shown in FIG. 5, if we assume that the given range of timing is 'less than −2 ns', then the datapath output unit 102 creates the datapath list 109 with only two datapaths [#1-#5] and [#2-#6] listed in it.

Consequently, the timing constraints are detected efficiently and are implemented even more rapidly without any specifications miss, eventually resulting in a shortening of the designing time.

Still another example of operation (hereinafter, "working example 5") of the timing constraints creating device 100 is explained next with reference to FIG. 1, FIG. 3, FIG. 6, and FIG. 7. FIG. 6 is a second type of data transfer pattern between the two child blocks of the parent block. FIG. 7 shows a first example of the datapath list 109 prepared by the datapath output unit 102 based on the data transfer pattern shown in FIG. 6. The user can specify the datapaths in this list that are to be excluded from the timing verification.

For the sake of convenience, the same data transfer pattern shown in FIG. 2 is shown in FIG. 6 and the same symbols that are used in FIG. 2 are used in FIG. 6. The only difference is that, in FIG. 6, two new clocks CLK and CLK0 are added.

In the child block 113, the sequential logic cells (#1) 115, (#2) 116, and (#3) 117 are driven by the clock CLK, while the sequential logic cell (#4) 118 is driven by the clock CLK0.

In the child block 114, the sequential logic cells (#5) 119, (#6) 120, and (#7) 121 are driven by the clock CLK, while the sequential logic cell (#8) 122 is driven by the clock CLK0.

When creating the datapath list 109 of all the datapaths shown in FIG. 3, the datapath output unit 102 also adds to the datapath list 109 the relationship between the two clocks, namely, 'clk-clk', 'clk-clk0', 'clk0-clk', and 'clk0-clk0', by which the sequential logic cells are driven, as shown in FIG. 7, thus enabling specification of timing exception for clock relationship as well.

Consequently, the timing constraints are detected efficiently and are implemented even more rapidly without any specifications miss, eventually resulting in a shortening of the designing time.

Still another example of operation (hereinafter, "working example 6") of the timing constraints creating device 100 is explained next with reference to FIG. 1, FIG. 3, and FIG. 6 through FIG. 8. FIG. 8 shows a second example of the datapath list 109 that the datapath output unit 102 shown in FIG. 1 prepares based on the data transfer pattern shown in FIG. 6. The user can specify the datapaths in this list to be excluded from the timing verification.

The datapath output unit 102 adds the relationship A-B between the two child blocks 113 and 114 to the datapath list 109 that includes all the datapaths shown in FIG. 3 as well as the relationships between the two clocks shown in FIG. 7, namely, 'clk-clk', 'clk-clk0', 'clk0-clk', and 'clk0-clk0', thereby allowing the user to select the relationship A-B between the two child blocks 113 and 114 for timing exception.

Consequently, the timing constraints are detected efficiently and are implemented even more rapidly without any specifications miss, eventually resulting in a shortening of the designing time.

Still another example of operation (hereinafter, "working example 7") of the timing constraints creating device 100 is explained next. The working example 7 is a first variation of the working examples explained above. Though not shown in FIG. 1, a provision is made in the present invention such that the user can specify the contents of the datapath list 109 created by the datapath output unit 102. As a result, the following three procedures (1) through (3) can be carried out.

(1) In the working examples 1 through 3, 5 and 6, if the user specifies those datapaths for which it is necessary to verify the specification of the timing exceptions, then the datapath output 102 creates the datapath list 109 for all the datapaths, out of the datapaths extracted by the datapath extraction unit 101, that the user has specified.

(2) In the working example 4, if the user specifies the timing range (a fixed range), then the datapath output 102 creates the datapath list 109 for only those datapaths, out of the datapaths extracted by the datapath extraction unit 101, for which the timing falls within the fixed range that the user has specified.

(3) In the working examples 1 through 6, the user can specify one of the following paths:

1. an I/O path that occurs when data exchange is taking place between two adjoining child blocks existing at a next higher level, 2. an output path that occurs when a child block at a next higher level outputs data to an adjoining child block, and 3. an input path that occurs when data is input to a child block at a next higher level from an adjoining child block.

In this case, the datapath output unit 102 includes in the datapath list 109 all the datapaths of the child block specified by the user. This method is effective when the number of child blocks is very large.

Consequently, the timing constraints are detected efficiently and are implemented even more rapidly without any specifications miss, eventually resulting in a shortening of the designing time.

Still another example of operation (hereinafter, "working example 8") of the timing constraints creating device 100 is explained next. The working example 8 is a second variation of each type of the working examples explained above. In other words, the datapath extraction unit 101 is provided in the present invention such that the following operations (1) through (3) can take place.

(1) In the working examples 1 through 6, if the user specifies those datapaths for which it is necessary to verify the specification of the timing exception, then the datapath extraction unit 101 extracts as datapaths for timing verification only those datapaths, out of the datapaths formed between the two child blocks 113 and 114, that the user has specified.

(2) In the working example 2, the datapath extraction unit 101 extracts as datapaths for timing verification only those datapaths, out of the datapaths formed between the two child blocks 113 and 114, in which the timing error has occurred.

(3) In the working example 4, the datapath extraction unit 101 extracts as datapaths for timing verification only those datapaths, out of the datapaths formed between the two child blocks 113 and 114, the timing of which falls within the fixed range as a result of the timing verification.

Consequently, the timing constraints are detected efficiently and are implemented even more rapidly without any specifications miss, eventually resulting in the shortening of the designing time.

According to the present invention, when designing a semiconductor integrated circuit, all datapaths that are formed between at least two child blocks in a parent block are extracted, out of the datapaths for timing verification from a timing constraints file, a netlist file and a cell library file, as the datapaths on which the timing verification is to be performed. The extracted datapaths are presented in the form of a datapath list from which the user can select the datapaths for timing exceptions. The previous timing constraints are then modified, according to the timing exceptions specified by the user, and new timing constraints are created. Consequently, the timing constraints are detected efficiently and are implemented even more rapidly without any specifications miss, eventually resulting in a shortening of the designing time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A device for creating timing constraints for a semiconductor integrated circuit designed using a hierarchical design, the device comprising:

a datapath extraction unit that extracts datapaths on which a timing verification is to be performed, wherein the datapath extraction unit extracts the datapaths, which are established between at least two child blocks in a parent block, from a cell library that includes description of logic function and timing information of each cell in the parent block, timing constraints that include definitions of any clocks of the semiconductor integrated circuit, and a netlist that includes connection information between cells in the parent block;

a datapath output unit that creates a datapath list which allows a user to selectively specify a timing exception corresponding to a datapath extracted, and displays the datapath list, for the user; and a timing constraints modification unit that creates new timing constraints by modifying existing timing constraints based on the timing exception specified by the user.

2. The device according to claim 1, wherein the datapath extraction unit extracts only the datapaths specified by the user.

3. The device according to claim 2, wherein the user specifies a datapath that performs transfer of data between the child blocks.

4. The device according to claim 2, wherein the user specifies a datapath that performs transfer of data from one of the child blocks to other child block.

5. The device according to claim 1, wherein the datapath output unit creates the datapath list of only the datapaths specified by the user.

6. The device according to claim 5, wherein the user specifies a datapath that performs transfer of data between the child blocks.

7. The device according to claim 5, wherein the user specifies a datapath that performs transfer of data from one of the child blocks to other child block.

8. The device according to claim 1, wherein the datapath output unit appends a result of a timing verification to each datapath in the datapath list.

9. The device according to claim 8, wherein the datapath extraction unit extracts only the datapath having a timing error.

10. The device according to claim 1, wherein the datapath output unit creates the datapath list of only the datapaths having timing error.

11. The device according to claim 1, wherein the datapath output unit creates the datapath list of each datapath for which a result of timing verification is within a predetermined range.

12. The device according to claim 1, wherein the datapath extraction unit extracts each datapath for which a result of timing verification is within a predetermined range.

13. The device according to claim 1, wherein the datapath output unit appends a clock relation to be specified as the timing exception to the datapath list, the clock relation being a relation between clocks input to the cells.

14. The device according to claim 1, wherein the datapath output unit appends a block relation to be specified as the timing exception to the datapath list, the block relation being a relation between the child blocks.

* * * * *